(12) United States Patent
Dierichs et al.

(10) Patent No.: US 7,697,116 B2
(45) Date of Patent: *Apr. 13, 2010

(54) LITHOGRAPHIC APPARATUS AND DEVICE MANUFACTURING METHOD

(75) Inventors: Marcel Mathijs Theodore Marie Dierichs, Venlo (NL); Hans Van Der Laan, Veldhoven (NL); Hendrikus Robertus Marie Van Greevenbroek, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 315 days.

This patent is subject to a terminal disclaimer.

(21) Appl. No.: 11/636,586

(22) Filed: Dec. 11, 2006

(65) Prior Publication Data

US 2007/0115449 A1    May 24, 2007

Related U.S. Application Data

(63) Continuation of application No. 10/784,895, filed on Feb. 24, 2004, now Pat. No. 7,170,587, which is a continuation-in-part of application No. 10/388,766, filed on Mar. 17, 2003, now Pat. No. 6,771,352.

(30) Foreign Application Priority Data

Mar. 18, 2002    (EP) .................................. 02251933

(51) Int. Cl.
 *G03B 27/72* (2006.01)
(52) U.S. Cl. ............................... 355/71; 355/53; 355/67
(58) Field of Classification Search .................. 355/53, 355/67, 71; 250/492.1, 492.2
See application file for complete search history.

(56) References Cited

U.S. PATENT DOCUMENTS 5,229,872 A    7/1993    Mumola (Continued)

FOREIGN PATENT DOCUMENTS

DE    199 35 568 A1    2/2001

(Continued)

OTHER PUBLICATIONS

Hecht, Optics, $2^{nd}$ Edition, Addison-Wesley Publishing Co., 1987, pp. 149-150.

(Continued)

*Primary Examiner*—Hung Henry Nguyen
*Assistant Examiner*—Steven H Whitesell-Gordon
(74) *Attorney, Agent, or Firm*—Pillsbury Winthrop Shaw Pittman, LLP

(57) ABSTRACT

A lithographic apparatus includes a device having a blade selectively insertable into the beam. The device is in a first plane intermediate a second plane conjugate to a plane of the substrate and a third plane conjugate to a pupil plane of the projection system. The blade may include a partially opaque blade and a solid blade or have a predetermined transmissibility pattern. The transmissibility may vary in a second direction perpendicular to the first direction in which the substrate and the patterning device are movable. In an illumination system including a field faceted mirror and a pupil faceted mirror, a reflecting blade is selectively insertable into the beam to reflect a portion of the beam to a beam dump that may be cooled to reduce a heat load. The reflecting element may have a coating that scatters the portion of radiation or changes the phase.

16 Claims, 14 Drawing Sheets

U.S. PATENT DOCUMENTS

| | | | |
|---|---|---|---|
| 5,296,891 A | 3/1994 | Vogt et al. | |
| 5,339,346 A | 8/1994 | White | |
| 5,512,759 A | 4/1996 | Sweatt | |
| 5,523,193 A | 6/1996 | Nelson | |
| 5,666,206 A * | 9/1997 | Uchiyama | 356/401 |
| 5,675,401 A | 10/1997 | Wangler et al. | |
| 5,969,441 A | 10/1999 | Loopstra et al. | |
| 6,040,892 A | 3/2000 | Pierrat | |
| 6,046,792 A | 4/2000 | Van Der Werf et al. | |
| 6,124,876 A * | 9/2000 | Sunagawa | 347/239 |
| 6,195,201 B1 | 2/2001 | Koch et al. | |
| 6,198,793 B1 | 3/2001 | Schultz et al. | |
| 6,225,027 B1 | 5/2001 | Replogle et al. | |
| 6,262,796 B1 | 7/2001 | Loopstra et al. | |
| 6,285,443 B1 | 9/2001 | Wangler et al. | |
| 6,359,969 B1 | 3/2002 | Shmaenok | |
| 6,404,499 B1 | 6/2002 | Stoeldraijer et al. | |
| 6,438,199 B1 | 8/2002 | Schultz et al. | |
| 6,452,661 B1 * | 9/2002 | Komatsuda | 355/67 |
| 6,452,662 B2 | 9/2002 | Mulkens et al. | |
| 6,573,978 B1 | 6/2003 | McGuire, Jr. | |
| 6,583,855 B2 | 6/2003 | Krikke et al. | |
| 6,671,035 B2 | 12/2003 | Eurlings et al. | |
| 6,737,662 B2 | 5/2004 | Mulder et al. | |
| 6,927,004 B2 | 8/2005 | Eurlings et al. | |
| 2003/0002021 A1 * | 1/2003 | Sato | 355/67 |
| 2003/0002022 A1 | 1/2003 | Schultz | |
| 2003/0227603 A1 | 12/2003 | Dierichs | |
| 2005/0270513 A1 | 12/2005 | Dierichs et al. | |

FOREIGN PATENT DOCUMENTS

| | | |
|---|---|---|
| EP | 0 939 341 A2 | 9/1999 |
| EP | 1 026 547 A2 | 8/2000 |
| EP | 0 939 341 A3 | 4/2001 |
| EP | 1 109 067 A2 | 6/2001 |
| EP | 1 202 101 A2 | 5/2002 |
| EP | 1 291 721 A1 | 3/2003 |
| JP | 10-303123 | 11/1998 |
| JP | 11-312638 | 11/1999 |
| JP | 2000-223415 | 8/2000 |
| JP | 2000-269114 | 9/2000 |
| JP | 2003-506881 | 2/2003 |
| WO | 98/33096 | 7/1998 |
| WO | 98/38597 | 9/1998 |
| WO | WO 00/11706 | 3/2000 |

OTHER PUBLICATIONS

Japanese Office Action issued for Japanese Patent Application No. 2003-116334 dated Mar. 1, 2007.

* cited by examiner

LITHOGRAPHIC APPARATUS AND DEVICE MANUFACTURING METHOD

CROSS REFERENCE TO RELATED APPLICATIONS

This application is continuation of U.S. application Ser. No. 10/784,895, filed Feb. 24, 2004 now U.S. Pat. No. 7,170,587, entitled "LITHOGRAPHIC APPARATUS AND DEVICE MANUFACTURING METHOD," which is a continuation-in-part of U.S. application Ser. No. 10/388,766, filed Mar. 17, 2003 and now U.S. Pat. No. 6,771,352, entitled "LITHOGRAPHIC APPARATUS AND DEVICE MANUFACTURING METHOD," which claims priority from European Application No. 02251933.4, filed Mar. 18, 2002, the entire contents of each being herein incorporated by reference. This application also incorporates by reference U.S. application Ser. No. 10/379,999, filed Mar. 6, 2003 and now U.S. Pat. No. 6,927,004, entitled "MASK FOR USE IN LITHOGRAPHY, METHOD OF MAKING A MASK, LITHOGRAPHIC APPARATUS, AND DEVICE MANUFACTURING METHOD," and Ser. No. 10/157,033, filed May 30, 2002 and now U.S. Pat. No. 6,737,662, entitled "LITHOGRAPHIC APPARATUS, DEVICE MANUFACTURING METHOD, DEVICE MANUFACTURED THEREBY, CONTROL SYSTEM, COMPUTER PROGRAM, AND COMPUTER PRODUCT." This application incorporates by reference U.S. Pat. No. 6,583,855, issued Jun. 24, 2003 and entitled "LITHOGRAPHIC APPARATUS, DEVICE MANUFACTURING METHOD, AND DEVICE-MANUFACTURED THEREBY."

BACKGROUND

1. Field of the Invention

The present invention relates to a lithographic projection apparatus and device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described above, the patterning device can include one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as set forth above.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Correct imaging of a pattern generated by a patterning device in a lithographic projection apparatus requires correct illumination of the patterning device. In particular, it is important that the intensity of illumination proximal the plane of the pattern, as generated by the patterning device, or proximal planes conjugate to the plane of the pattern, be uniform over the area of the exposure field. Also, it is generally required that the patterning device can be illuminated with off-axis illumination in a variety of modes such as, for example, annular, quadrupole or dipole illumination, to improve resolution. The use of such illumination modes is disclosed, for example, in U.S. Pat. No. 6,671,035. The illumination modes are obtained, for example, by providing a corresponding predetermined intensity distribution in a pupil of the illumination system.

To meet the above-mentioned requirements, the illumination system of a lithographic projection system is generally quite complex. A typical illumination system might include: shutters and attenuators configured to control the intensity of the beam output by the source, which might be a high pressure Hg lamp or an excimer laser; a beam shaping element such as, for example, a beam expander for use with an excimer laser radiation beam configured to lower the radiation beam divergence; a zoomable axicon pair and a zoom lens configured to set the illumination mode and parameters (collectively referred to as a zoom-axicon); an integrator, such as a quartz rod, configured to make the intensity distribution of the beam more uniform; masking blades configured to define the illumination area; and imaging optics configured to project an image of the exit of the integrator onto the patterning device. For simplicity, the plane of the pattern generated by the patterning device, and planes conjugate to this plane in the illumination system and the projection system may be referred to hereinafter as "image" planes.

The illumination system may also include elements configured to correct non-uniformities in the illumination beam at or near image planes. For example, the illumination system may include diffractive optical elements to improve the match of the beam cross-section proximal the entrance face of the integrator rod with the shape of the entrance face. A diffractive optical element typically includes an array of microlenses, which may be Fresnel lenses or Fresnel zone plates. Improving the match alleviates the problem of field dependent lithographic errors occurring in the patterned layer. The matching may hereinafter be referred to as "filling" of the integrator entrance face. A diffractive optical element may also be positioned, for example, in front of a beam shaping element, such as a zoom-axicon, to transform the angular distribution of radiation provided by an excimer laser beam into a predetermined angular distribution of radiation to generate a desired illumination mode. Illumination systems as discussed above are disclosed, for example, in U.S. Pat. Nos. 5,675,401 and 6,285,443.

The illumination system may also include, for example, a filter partially transmissive to radiation of the beam with a predetermined spatial distribution of transmittance, immediately before the plane of the pattern, to reduce spatial intensity variations.

The illumination systems discussed above still suffer from various problems, however. In particular, various elements that are used, especially diffractive optical elements and quartz-rod integrators, can introduce an anomaly of intensity distribution in a plane perpendicular to the optical axis of the radiation system or the projection system. For example, in a plane proximal a pupil of the radiation system or the projection system, either the beam cross-section may be elliptical rather than circular, or the beam intensity distribution within the beam cross-section may, for example, be elliptically symmetric rather than circularly symmetric. Both types of errors are referred to as "ellipticity of the beam" or simply as "ellipticity error," and typically lead to specific lithographic errors in the patterned layers. In particular, a patterned feature occurring in directions parallel to both the X and Y direction may exhibit, in the presence of ellipticity of the beam, different sizes upon exposure and processing. Such a lithographic error is usually referred to as H-V difference. Also, a diffractive optical element used to improve filling of the integrator is generally only optimum for one setting of the zoom-axicon. For other settings, the integrator entrance face may be under-filled (the beam cross-section is smaller than the integrator entrance face), leading to substantial field dependent H-V difference. For other settings, the integrator entrance face may also be over-filled, leading to energy wastage. Additionally, 157 nm excimer lasers and other excimer lasers tend to have large divergence differences in X and Y directions which cannot be completely resolved using beam expander lenses while keeping the shape of the beam within acceptable dimensions.

Ellipticity errors in the beam may also be caused by subsequent elements, such as the mask and elements of the projection system. Current lithographic apparatus do not correct or compensate for ellipticity errors introduced into the beam by elements subsequent to the illumination system.

In a lithographic apparatus, it is important that illumination of the patterning device is uniform in field and angle distribution and, for illumination modes such as dipole and quadrupole illumination, all poles are equal. To achieve this, an integrator is provided in the illumination system. In a lithographic apparatus using UV or DUV exposure radiation the integrator may take the form of a quartz rod or a so-called fly's eye lens. A fly's eye lens is a lens built up of a large number of smaller lenses in an array which creates a correspondingly large number of images of the source in a pupil plane of the illumination system. These images act as a virtual, or secondary, source. However, when using EUV exposure radiation the illumination system must be constructed from mirrors because there is no known material suitable for forming a refractive optical element for EUV radiation. In such an illumination system, a functional equivalent to a fly's eye lens can be provided using faceted mirrors, for instance as described in U.S. Pat. Nos. 6,195,201, 6,198,793 and 6,452,661. These documents describe a first, or field, faceted mirror which focuses a plurality of images, one per facet, on a second, or pupil, faceted mirror which directs the light to appropriately fill the pupil of the projection system. It is known from UV and DUV lithography that imaging of different types of mask patterns can be improved by controlling the illumination settings, e.g. the filling ratio of the pupil of the projection system (commonly referred to as a) or the provision of special illumination modes such as annular, dipole or quadrupole illumination. More information on illumination settings can be obtained from U.S. Pat. No. 6,452,662 and U.S. Pat. No. 6,671,035.

In an EUV lithographic apparatus with a fly's eye integrator, these illumination settings can be controlled by selectively blocking certain of the pupil facets. However, because the source position and size on each facet is not exactly known and not stable, it is necessary to block off whole facets at a time, rather than partial facets. Thus, only relatively coarse control of illumination settings is possible. Also, to provide an annular illumination setting it is necessary to obscure the innermost pupil facets and when positioning a masking blade over an inner facet it is difficult to avoid partially obscuring one or more of the outer facets.

Referring to FIGS. 14a and 14b, a pupil plane includes a plurality of overlapping pupils. The overlapping pupils produce a field plane. As shown in FIGS. 14a and 14b, a square field plane is formed by four overlapping cones of radiation in the pupil plane. In the pupil plane, the pupil shape can be corrected for all field positions with transmission filters. The pupil distribution cannot be influenced over the field in a controlled manner. Only a pupil correction that is constant over the field can be applied. In the field plane, the uniformity profile can be changed for all angles with transmission filters. Transmission filters can only change the transmission for all angles.

In order to make field dependent corrections to the pupil distribution, the correction must take place between the pupil plane and the field plane. The difficulty is that the pupil of one field point overlaps with the pupil of an adjacent field point. In an intermediate plane, the left portion of a pupil corresponding to a right field point overlaps with the right portion of a pupil corresponding to a left field point. Accordingly, it is not possible to correct one portion of the pupil for one field point without affecting the pupil for another field point.

SUMMARY

According to an exemplary embodiment of the present invention, a lithographic apparatus includes a radiation system configured to provide a beam of radiation. The radiation system includes an illumination system. A support is configured to support a patterning device and the patterning device is configured to pattern the beam of radiation according to a desired pattern. A substrate table is configured to hold a substrate. The apparatus also includes a projection system configured to project the patterned beam of radiation onto a target portion of the substrate; and a device positioned in a first plane intermediate a second plane conjugate to a plane of the substrate and a third plane conjugate to a pupil plane of the projection system. The device includes a plurality of blades. Each blade is selectively insertable into the beam of radiation.

According to another aspect of the present invention a device manufacturing method includes providing a beam of radiation using a radiation system, the radiation system including an illumination system; using a patterning device to endow the beam of radiation with a pattern in its cross-section; projecting the patterned beam of radiation onto a target portion of a layer of radiation-sensitive material at least partially covering a substrate using a projection system; and selectively inserting at least one blade of a plurality of blades into the beam of radiation in a first plane intermediate a second plane conjugate to a plane of the substrate and a third plane conjugate to a pupil plane of the projection system.

According to still another aspect of the present invention, a lithographic apparatus includes a radiation system configured to provide a beam of radiation, the radiation system including an illumination system, the illumination system including a field faceted mirror and a pupil faceted mirror. A support is configured to support a patterning device and the patterning device is configured to pattern the beam of radiation according to a desired pattern. A substrate table is configured to hold a substrate and a projection system is configured to project the patterned beam of radiation onto a target portion of the substrate. A plurality of reflective blades are each selectively insertable into the beam of radiation in front of at least one facet of at least one of the field faceted mirror and the pupil faceted mirror to reflect a portion of the beam of radiation to a beam dump.

According to an even further aspect of the present invention, a device manufacturing method includes providing a beam of radiation using a radiation system, the radiation system including an illumination system, the illumination system including a field faceted mirror and a pupil faceted mirror; using a patterning device to endow the beam of radiation with a pattern in its cross-section; projecting the patterned beam of radiation onto a target portion of a layer of radiation-sensitive material at least partially covering a substrate using a projection system; and selectively inserting at least one reflective blade into the beam of radiation in front of at least one facet of at least one of the field faceted mirror and the pupil faceted mirror to reflect a portion of the beam of radiation to a beam dump.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet radiation (EUV), e.g. having a wavelength in the range 5-20 nm, especially around 13 nm, as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
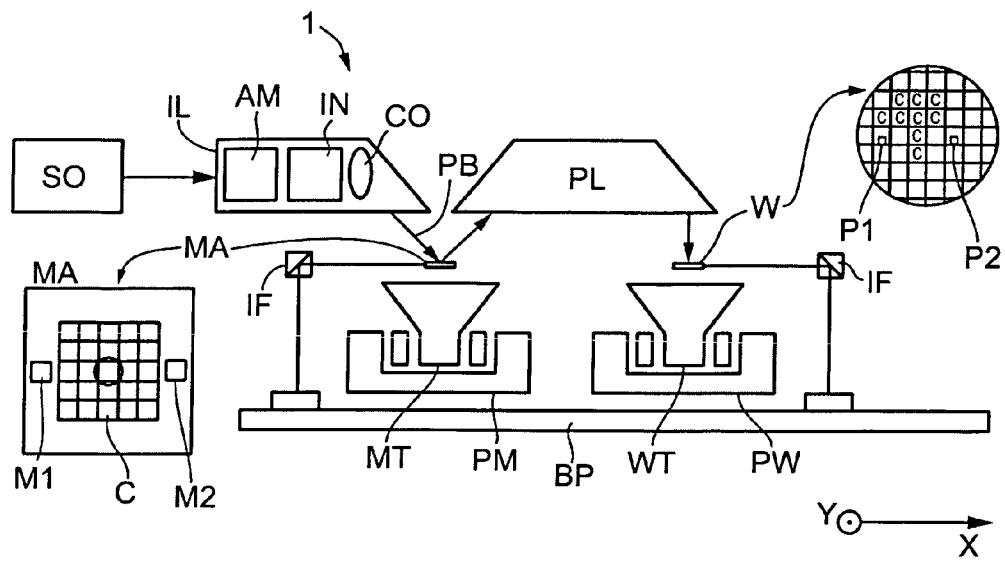
FIG. 1 is a schematic illustration of a lithographic projection apparatus according to an exemplary embodiment of the present invention.

FIG. 1 schematically depicts a lithographic projection apparatus 1 according to an embodiment of the invention. The apparatus 1 includes a base plate BP. A illumination system is configured to supply a beam PB of radiation (e.g. EUV radiation). A radiation source SO is configured to provide radiation to the illumination system IL. The source SO and the apparatus 1 may be separate, for example when the source is a plasma discharge source. In such case, the source SO is not considered to form part of the apparatus 1 and the radiation beam is generally passed from the source LA to the illumination system IL with the aid of a radiation collector including, for example, suitable collecting mirrors and/or a spectral purity filter. In other cases, the source SO may be integral with the apparatus 1, for example when the source SO is a mercury lamp. The present invention encompasses both of these scenarios. The source SO and the illumination system IL may be referred to as a radiation system.

A first object (mask) table MT provided with a mask holder is configured to hold a mask MA (e.g. a reticle), and is connected to a first positioning device PM configured to accurately position the mask with respect to a projection system or lens PL. A second object (substrate) table WT provided with a substrate holder is configured to hold a substrate W (e.g. a resist-coated silicon wafer), and is connected to a second positioning device PW configured to accurately position the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source SO (e.g. a discharge or laser-produced plasma source) produces radiation. The radiation is fed into the illumination system IL, either directly or after having traversed a conditioning device, such as a beam expander Ex, for example. The illumination system IL may include an adjusting device AM that sets the outer and/or inner radial extent (commonly referred to as σ-outer and σ-inner, respectively) of the angular intensity distribution in the radiation beam. In addition, it will generally include various other components, such as an integrator IN and a condenser CO. In this way, the beam PB impinging on the mask MA has a desired uniformity and intensity distribution in its cross-section.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
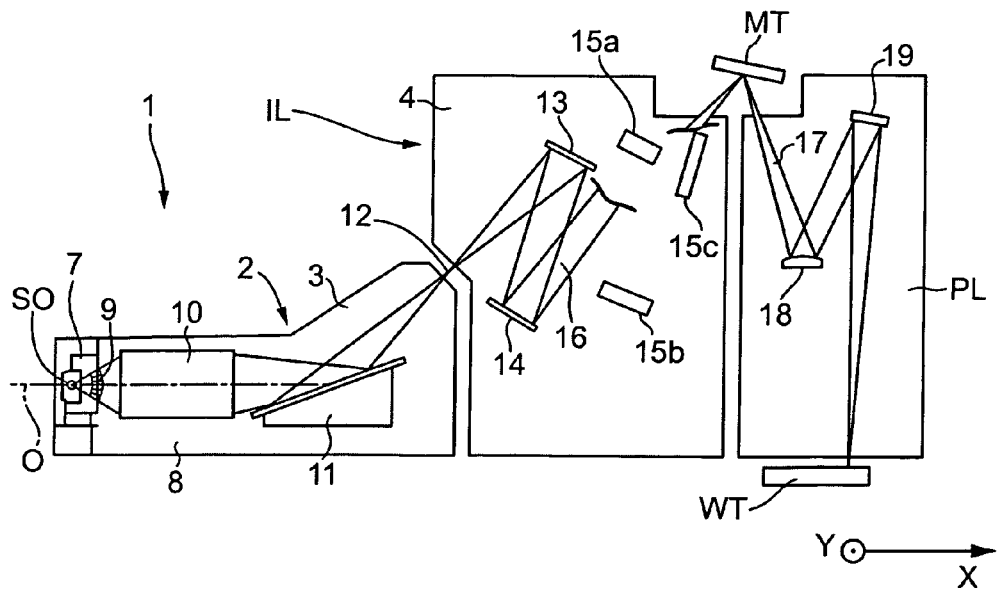
FIG. 2 is a schematic illustration of a lithographic projection apparatus according to an exemplary embodiment of the present invention.

FIG. 2 shows the projection apparatus 1 according to an exemplary embodiment including the illumination system IL, the source SO, and the projection system PL. The source SO includes a source collector module or radiation unit 3. The illumination system IL includes an illumination optics unit 4. A radiation system 2 includes the source-collector module or radiation unit 3 and the illumination optics unit 4. The radiation unit 3 is provided with the radiation source SO which may be formed by a discharge plasma. An EUV radiation source may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. The radiation emitted by radiation source SO is passed from a source chamber 7 into a collector chamber 8 via a gas barrier structure or "foil trap" 9. The gas barrier structure 9 includes a channel structure such as, for example, described in U.S. Pat. No. 6,359,969. The collector chamber 8 includes a radiation collector 10, which may be formed by a grazing incidence collector. Radiation passed by the collector 10 is reflected off a grating spectral filter 11 to be focused in a virtual source point 12 at an aperture in the collector chamber 8. From the collector chamber 8, the radiation beam is directed to the illumination optics unit 4.

Figure 3A:
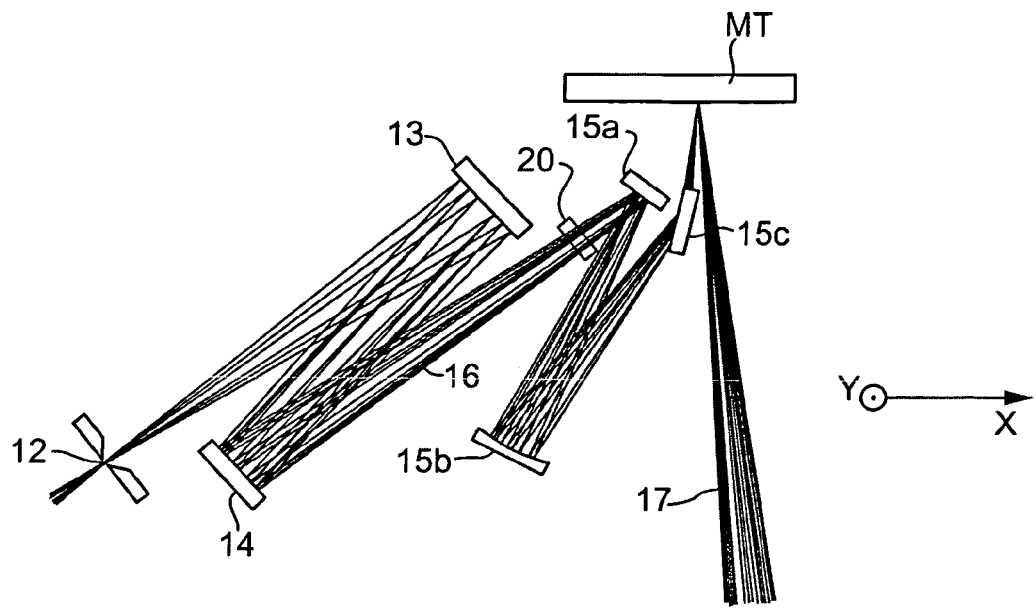
FIG. 3a is a schematic illustration of an illumination system according to an exemplary embodiment of the present invention.
Figure 3B:
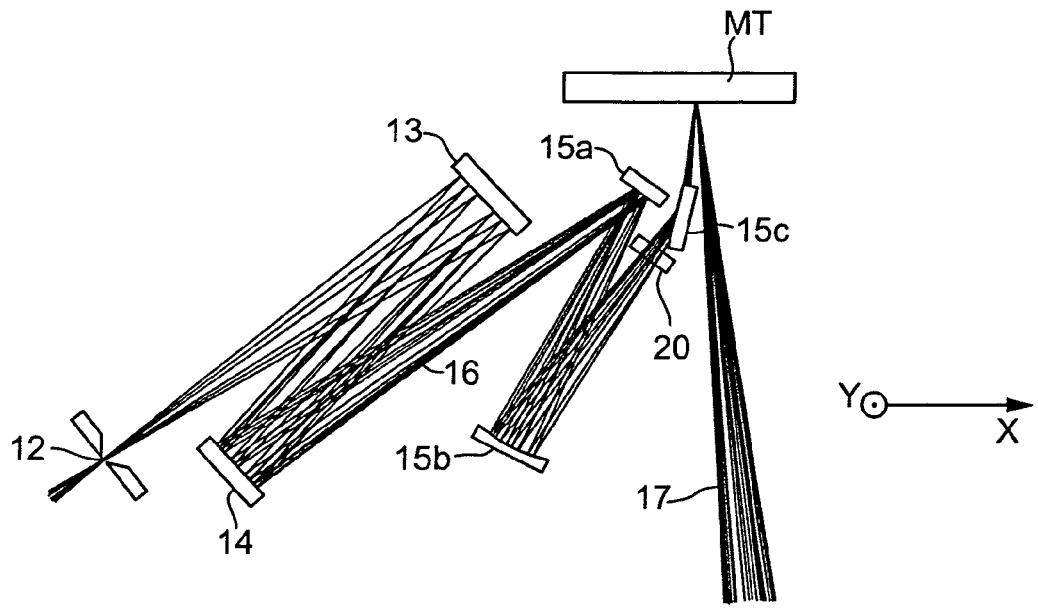
FIG. 3b is a schematic illustration of an illumination system according to another exemplary embodiment of the present invention.
Figure 4:
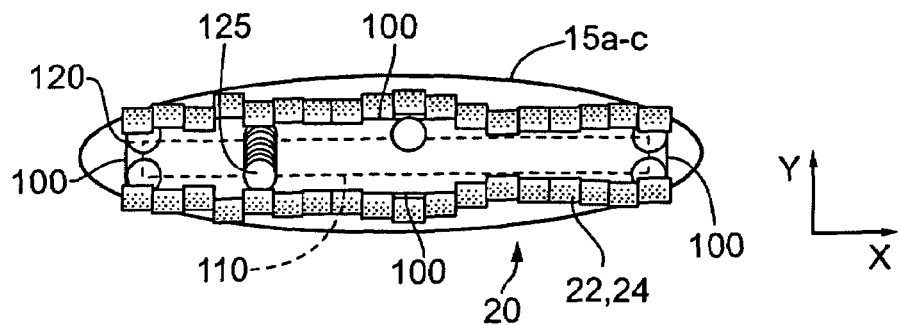
FIG. 4 is a schematic illustration of an ellipticity correction device according to an exemplary embodiment of the present invention.
Figure 5:
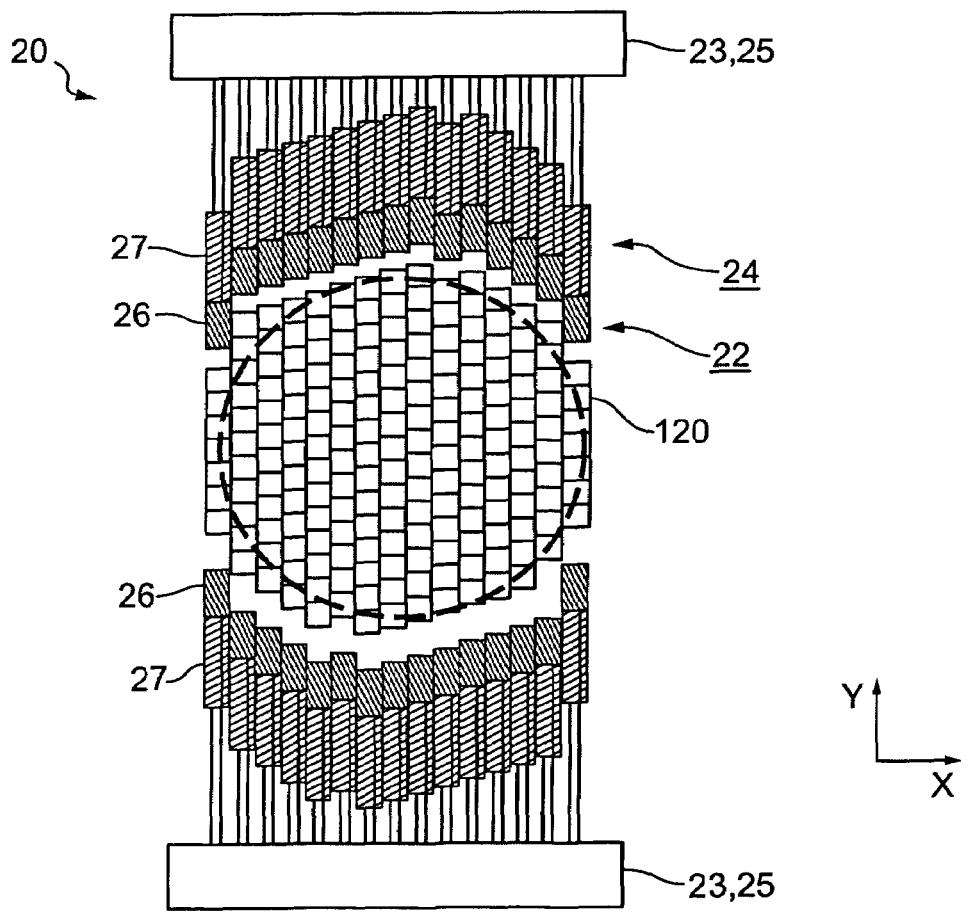
FIG. 5 is a further schematic illustration of the device of FIG. 4.

The illumination optics unit 4 includes a field faceted mirror 13 including a plurality of field facets (not shown) and a pupil facet mirror 14 including a plurality of pupil facets 120 (FIGS. 4 and 5). In the present embodiment, three mirrors 15a, 15b, 15c magnify and shape the beam 16 before it impinges on the mask on the mask table MT. The path of the beam 16 is shown in more detail in FIGS. 3a and 3b. The mirror 15a may preferably be a toroidal mirror, the mirror 15b may preferably be a spherical mirror, and the mirror 15c may preferably be a grazing incidence mirror. A patterned beam 17 is formed which is imaged in projection system PL via reflective elements 18, 19 onto the wafer on the substrate table WT. More elements than shown may generally be present in illumination optics unit 4 and the projection system PL.

Referring to FIG. 4, there is a position along the beam trajectory between the pupil faceted mirror 14 and the mask where the cross-section of the beam 16 is substantially rectangular. The size of the beam cross-section at this position corresponds to the size of the field facets of mirror 13. The cross-section of the beam at this position is blurred by a convolution with the pupil spot distribution and is thus not in focus with respect to the field plane. As shown in FIGS. 3a and 3b, the position is after the pupil faceted mirror 14 and in front of one of the mirrors 15a, 15b, or 15c, and preferably relatively close to the field plane compared to the pupil plane. It should be appreciated that an ellipticity correction device 20 may be positioned other than as shown in the exemplary embodiments of FIGS. 3a and 3b.

As shown in FIG. 4, the position is in front of one of the mirrors 15a, 15b, or 15c and the actual size of the field plane at the position is shown by solid lines 100. The size of the field plane before convolution with the pupil spots 120 is shown by dashed lines 110. The cross-section of the beam at the position is substantially rectangular. Pupil spots 120, including integrated pupil spots 125, are distributed throughout the cross section of the beam at the position. The device 20, including a plurality of adjustable blades 22, 24 is provided at the position. The blades 22, 24 are adjustable by linear actuators 23, 25 (FIG. 5) to be inserted into the beam in the Y direction. The position of the device 20 is schematically illustrated in FIG. 3a as prior to the mirror 15a in a direction of propagation of the beam, but as discussed above the device 20 may be positioned in front of either mirror 15b or 15c. The device 20 may be positioned anywhere between the pupil faceted mirror 14 and the mask, such as shown in FIG. 3b for example, but is preferably positioned relatively close to the field plane in comparison to the pupil plane.

Referring to FIGS. 4 and 5, the positions of the blades 22, 24 are adjustable by the linear actuators 23, 25 to be insertable into the beam 16 in the Y direction so that part of the pupil spots 120, 125 are covered. The blades 22, 24 are adjusted so that only those pupil spots 120, 125 that correspond to positions at the edge of the cross section of the beam 16 in the Y direction are covered. The amount of radiation incident under an angle in the Y direction, i.e. the "vertical light," is decreased in those pupil spots 120, 125 that are covered, wholly or partially. Thus, when a scan is performed the integrated vertical light is less than the "horizontal light," i.e., the radiation incident under an angle in the X direction. The device 20 corrects or compensates the ellipticity value (the ratio of the vertical light to the horizontal light) of the beam at the position by taking into account the ellipticity error(s) that may be introduced into the beam by subsequent elements of the illumination system, the mask, and/or the projection system. The ellipticity value can be corrected or compensated by decreasing the amount of vertical light only. By absorbing or blocking vertical light at selected positions in the X direction, the total amount of light decreases and the uniformity, i.e. intensity variation over the cross section of the beam, is corrected or compensated. The variation may be corrected by an apparatus such as the one disclosed in U.S. Pat. No. 6,404,499, for example.

Referring to FIG. 5, the device 20 includes partially opaque blades 22 and solid blades 24 connected to respective linear actuators 23 and 25 so as to be selectively and incrementally insertable into the beam in the Y direction. The blades 22 and 24 may also be reflective. The blades may have a reflection profile that varies from completely reflecting to fully absorbing. The blades 22 and 24 are constructed as a plurality of fingers 26 and 27, one of each per column of field or pupil facets that are selectively and incrementally extendible to cover ones of the field or pupil facets. However, it should be appreciated that pairs or groups of fingers may be grouped together.

Figure 6:
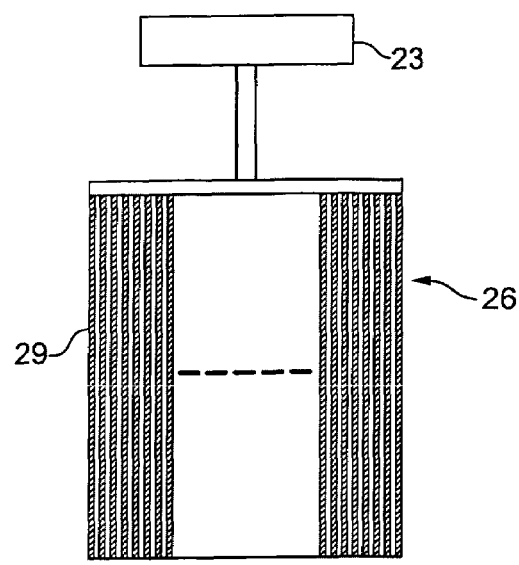
FIG. 6 is a schematic illustration of a portion of the device of FIGS. 4 and 5.

The partially opaque fingers may be constructed, for example, as a grid of rods, bars or wires or by forming apertures in a suitable pattern in a solid plate. A partially opaque finger 26 formed with a plurality of rods 29 is shown in FIG. 6.

In general, for other shapes and arrangements of pupil spots, the blades 22 and 24 may be arranged differently. As an alternative to adjustable blades, it is possible to provide a plurality of blades, partially opaque, solid and/or reflecting, corresponding to desired illumination settings and selectively interpose these into the beam 16 as desired. Such fixed blades may be formed as plates with appropriate openings and partially opaque (apertured) areas and may be held in a magazine or carousel to be inserted into the beam.

By providing multiple partially opaque blades with different blocking ratios, smaller increments of the pupil filling ratio a can be provided. For example, with two appropriately aligned partially opaque blades, one blocking 25% and one blocking 50%, quarter steps can be provided. A step is one row or column on the field or pupil facet mirror. For example, by extending the 25% blade one more step than a solid masking blade a quarter step is provided. Extending the 50% blade one step more provides a half step and both the 25% and 50% blade extended one more step provides a three quarter step.

Figures 7A, 7B:
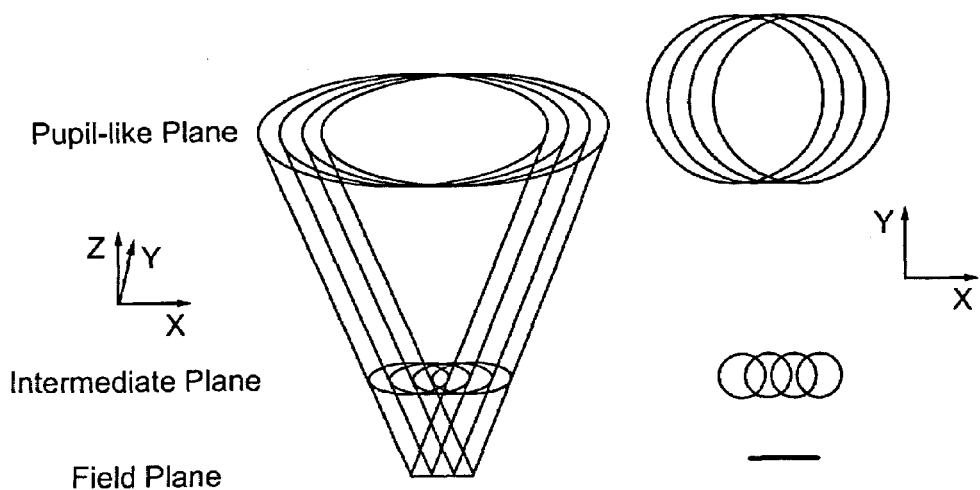
FIGS. 7a and 7b are perspective and plan view schematic illustrations, respectively, of a radiation beam.

Referring to FIGS. 7a and 7b, the field plane and the pupil plane for a beam in a step and scan lithographic apparatus are schematically illustrated. In an intermediate plane, there is a field-like distribution in the X (non-scanning) direction and a pupil-like distribution in the Y (scanning) direction. As in the exemplary embodiment discussed above, it is possible to place a filter at the edges of the intermediate plane in the Y direction. To properly perform a pupil compensation or correction, the compensation or correction must be done relatively far from the field plane. The correction or compensation is preferably performed relatively far from the reticle. In a step and scan apparatus, the beam cross section has a relatively small dimension in the Y (scanning) direction and a relatively larger dimension in the X (non-scanning) direction. The beam cross section is thus pupil-like in the scanning (Y) direction relatively close to the field plane and field-like in the non-scanning (X) direction. The pupil may thus be corrected in the scanning direction by inserting filters having predetermined absorbing patterns into the intermediate plane in the scanning (Y) direction.

Figure 8:
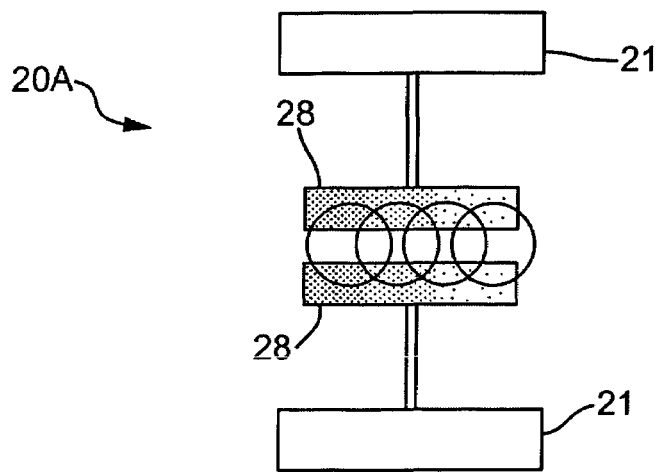
FIG. 8 is a schematic illustration of a device according to another exemplary embodiment of the present invention.

Referring to FIG. 8, blades or plates 28 having predetermined transmissibility/absorbing patterns are insertable in the Y direction into the edges of the intermediate plane to correct the ellipticity value. The blades 28 are insertable and adjustable by linear actuators 21, similar to the embodiment described above. The transmissibility/absorbing pattern of the blades 28 may be formed to provide a predetermined field dependence to the device 20A. As shown, the pattern of the blades 28 varies in the non-scanning (X) direction and thus the correction or compensation can vary in the non-scanning direction.

Figures 9A, 9B, 9C:
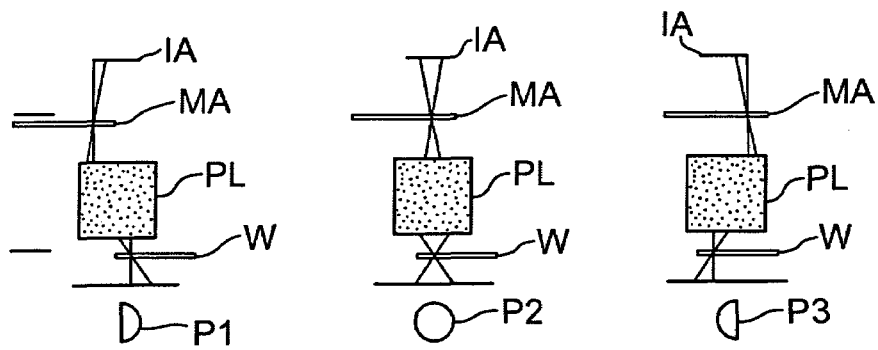
FIGS. 9a-9c are schematic illustrations of the operation of a step and scan lithographic apparatus according to an exemplary embodiment of the present invention.

Referring to FIGS. 9a-c, in a step and scan lithographic apparatus 1, the pupil P as seen on the substrate W changes during a scan. The illuminated area IA is defined as a sharp image of a quartz rod integrator (discussed in more detail below). FIG. 9a schematically illustrates the pupil P1 as seen by the substrate W immediately after the beginning of a scan. FIG. 9b schematically illustrates the pupil P2 as seen by the substrate W in the middle of a scan. FIG. 9c schematically illustrates the pupil P3 as seen by the substrate W immediately prior to the end of a scan. Although the step and scan apparatus illustrated in FIGS. 9a-c uses a transmissive mask, it should be appreciated that the present invention also contemplates the use of reflective masks.

Figure 10:
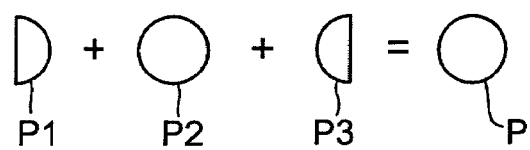
FIG. 10 is a schematic illustration of an effective or total pupil spot as seen by a wafer in a step and scan lithographic apparatus according to FIGS. 9a-9c.

Referring to FIG. 10, the sum of all the static pupils P1-P3 seen by the substrate results in the effective or scanning pupil P. Although three static pupils P1-P3 are schematically illustrated, it should be appreciated that during a scan a significantly larger number of static pupils are summed to produce the effective or scanning pupil.

Figure 11:
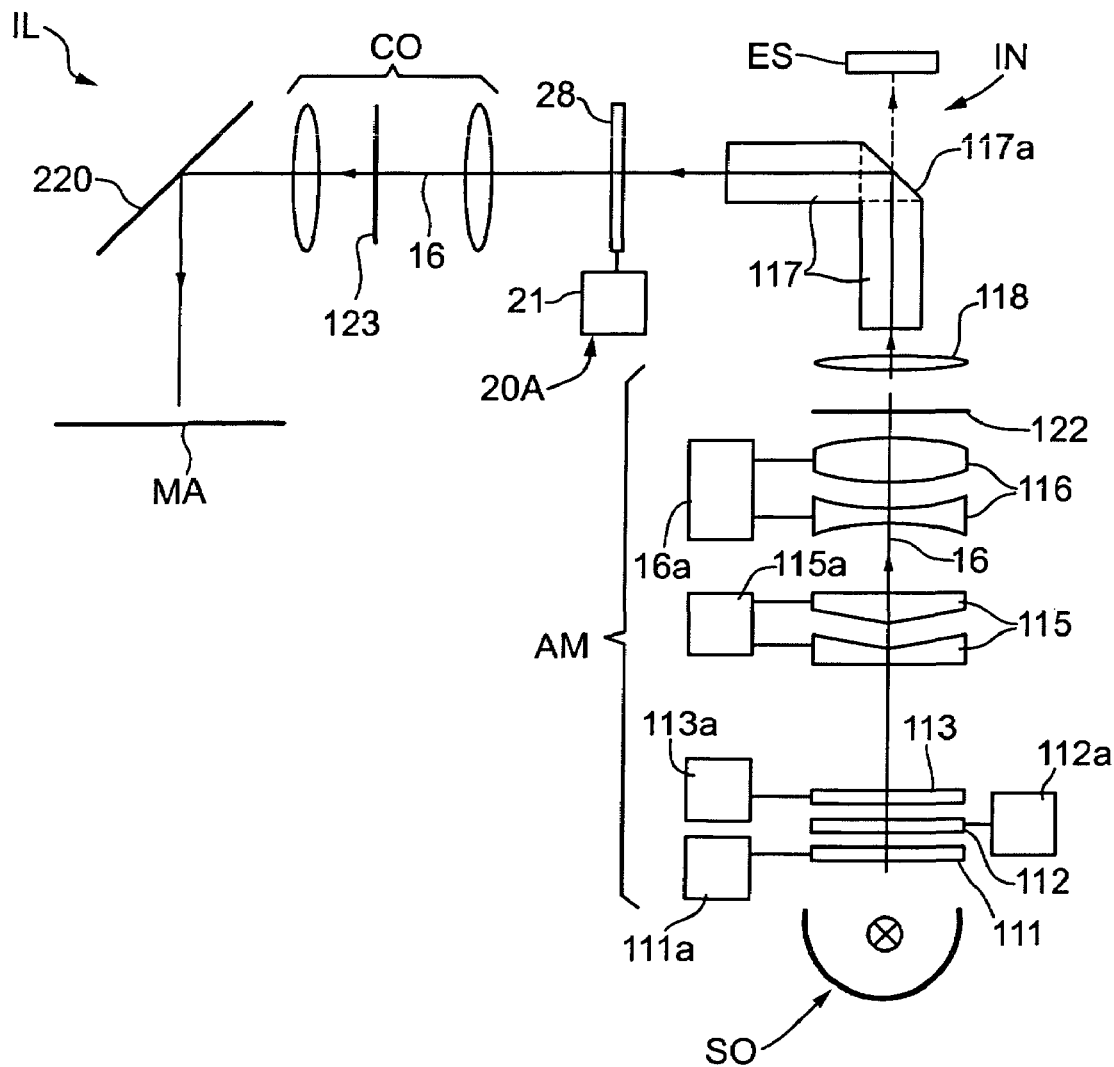
FIG. 11 is a schematic illustration of an illumination system according to an exemplary embodiment of the present invention.

Referring to FIG. 11, an illumination system IL according to another exemplary embodiment of the present invention includes a radiation source SO, for example a high pressure Hg lamp provided with an elliptical reflector to collect the output radiation or a laser. Two shutters are provided to control the output of the lamp: a safety shutter 111 held open by a coil 111a and arranged to close automatically if any of the panels of a casing of the lithographic apparatus are opened. A rotary shutter 112 is driven by a motor 112a for each exposure. A second rotary shutter 113 is driven by a motor 113a and a light attenuating filter in the shutter aperture may be provided for low-dose exposures.

Beam shaping is principally performed by an axicon 115 and zoom lens 116, which are adjustable optical elements driven by respective servo systems 115a, 116a. These components are referred to collectively as the zoom-axicon. The axicon 115 includes a concave conical lens and complementary convex conical lens whose separation is adjustable. Setting the two elements of the axicon 115 together provides conventional circular illumination, while moving them apart creates an annular illumination distribution.

The zoom lens 116 determines the size of the beam or the outer radius of an annular illumination mode. A pupil shaping device (not shown) may be inserted, for instance, in the exit pupil 122 of the zoom-axicon module to provide quadrupole or other illumination modes. Coupling optics couple the light from the zoom-axicon into an integrator IN.

The integrator IN includes, for example two elongate quartz rods 117 joined at a right-angle prism 117a, the hypotenuse surface of which is partially silvered to allow a small, known proportion of the beam energy through to an energy sensor ES. The beam undergoes multiple internal reflections in the quartz rods 117 so that, looking back through it, there is seen a plurality of spaced apart virtual sources, thus evening out the intensity distribution of the beam. It should be appreciated that a fly's eye lens could be used as the integrator.

After the exit of the integrator IN the device 20A is positioned to correct or compensate for the ellipticity value of the illumination area IA, i.e. the area of the reticle to be illuminated. The condensing optics CO form an objective lens for imaging the masking orifice, via an intermediate pupil 123, on the mask MA. A folding mirror 220 is included for convenient location of the illumination system in the apparatus.

According to another exemplary embodiment of the present invention, the pupil filling ratio σ may be controlled by providing adjustable, reflective coated blades in the illumination system. This exemplary embodiment is useful in lithographic apparatus using EUV radiation as blades which absorb radiation, such as those disclosed in U.S. application Ser. No. 10/388,766, will experience a significant heat load which may adversely affect the performance of the faceted mirrors used in EUV illumination systems and other optical elements.

Figure 12A:
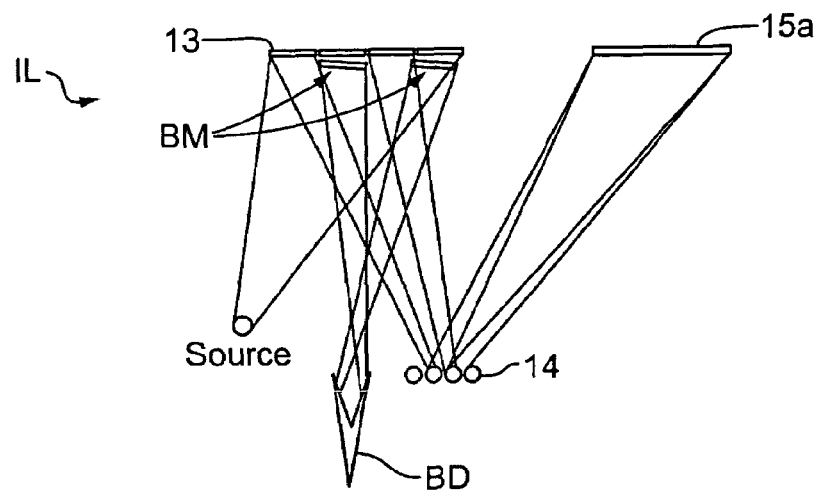
FIG. 12a is a schematic illustration of an illumination system according to an yet another exemplary embodiment of the present invention.
Figure 12B:
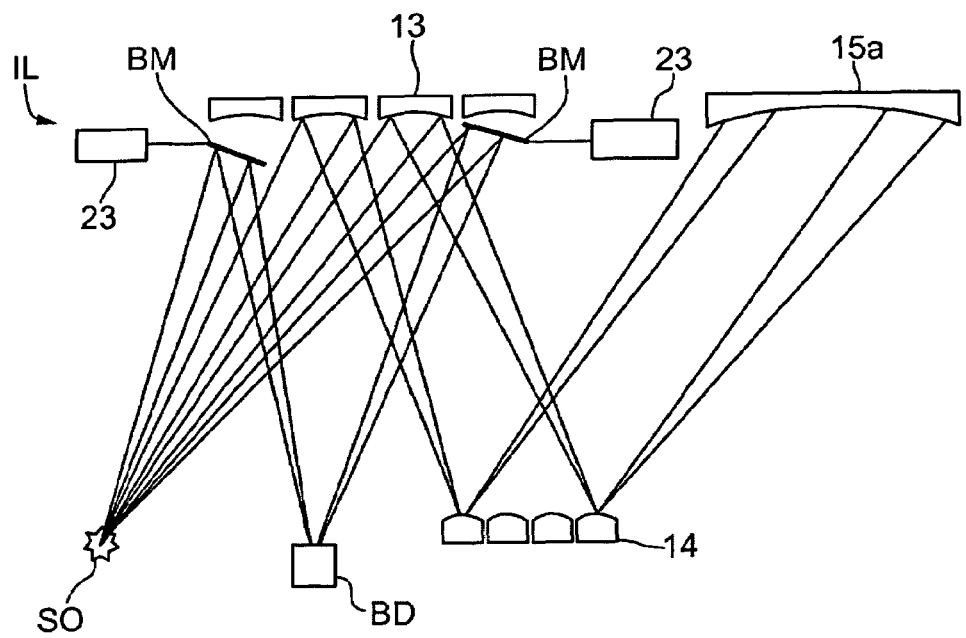
FIG. 12b is a schematic illustration of the illumination system of FIG. 12a in a different configuration.

Referring to FIGS. 12a and 12b, the illumination system includes blade mirrors BM selectively insertable or positionable in front of facets of the field faceted mirror 13. The blade mirrors BM are coated to be reflective. The coating may include a surface roughness so that the reflected radiation is scattered. Such a coating is disclosed in U.S. Pat. No. 6,927, 004, incorporated herein by reference. The coating may also include a phase changing structure so that the reflected radiation from individual blade mirrors cancel each other. Such a coating including a phase changing structure is disclosed in U.S. Pat. No. 6,927,004.

The radiation reflected by the blade mirrors BM is directed to a beam dump BD which may be cooled to prevent adverse effects on the performance of the apparatus.

Figure 13A:
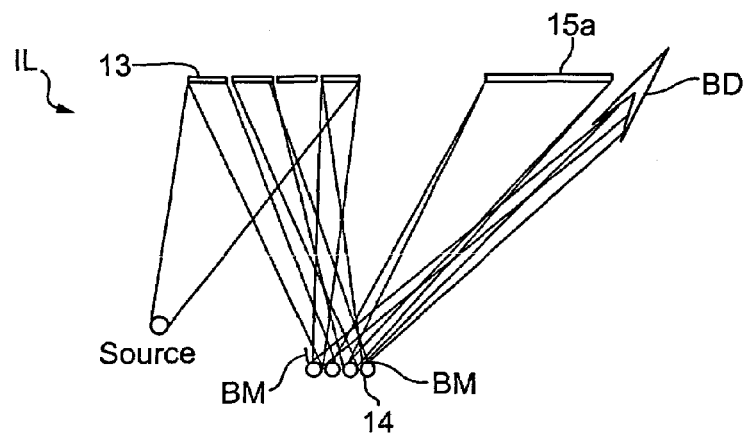
FIG. 13a is a schematic illustration of an illumination system according to a still further exemplary embodiment of the present invention.
Figure 13B:
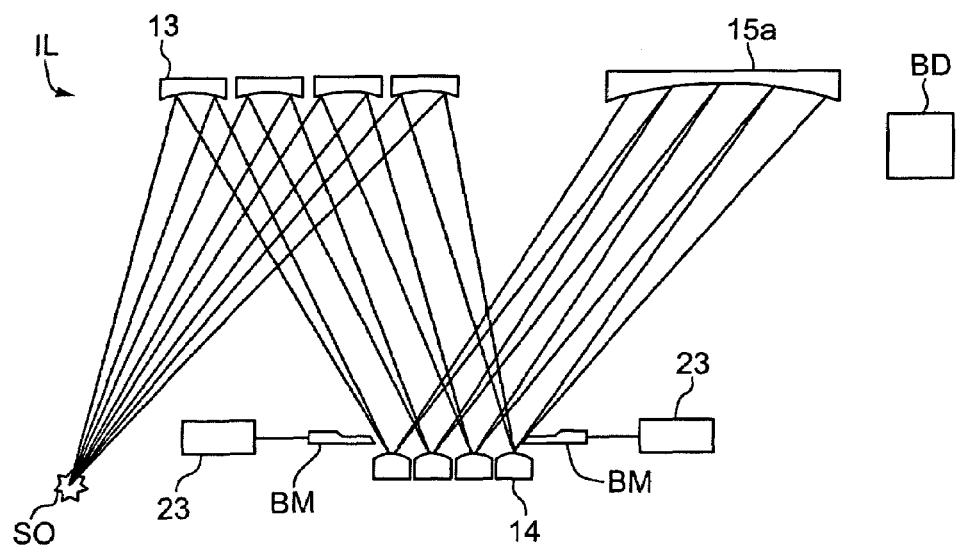
FIG. 13b is a schematic illustration of the illumination system of FIG. 13a in a different configuration.
Figures 14A, 14B:
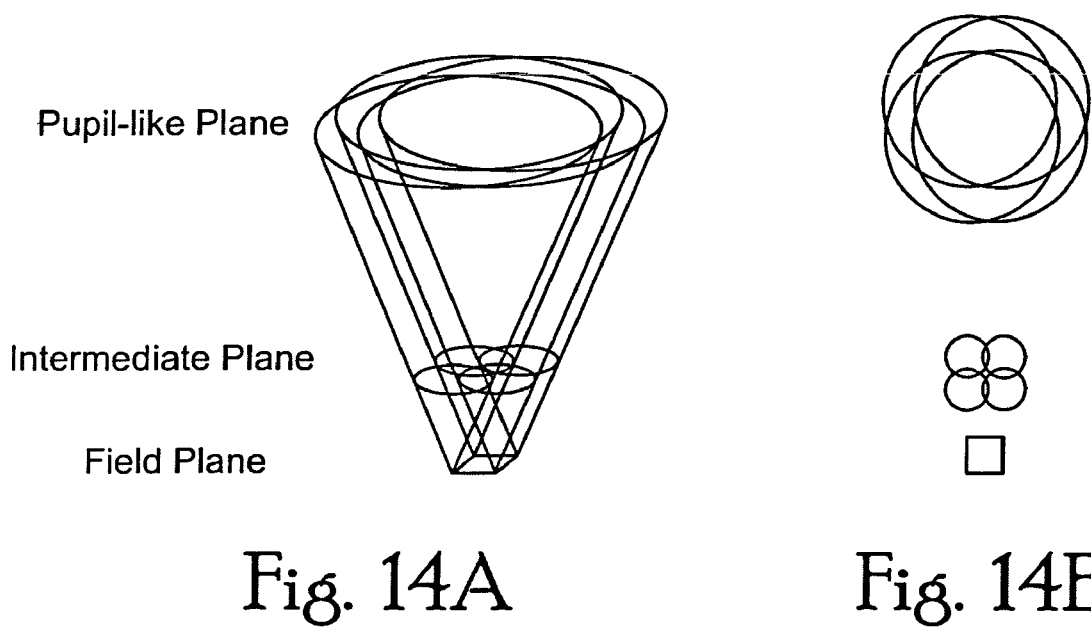
FIGS. 14a and 14b are schematic illustrations of a radiation beam of an illumination system of a step and scan lithographic apparatus.

Referring to FIGS. 13a and 13b, an illumination system according to another exemplary embodiment of the present invention includes blade mirrors BM selectively insertable or positionable in front of facets of the pupil faceted mirror 14. The blade mirrors BM are coated so as to be reflective. The coating may include a surface roughness such that the reflected radiation is scattered or may include a phase changing structure so that the reflected radiation from individual blade mirrors cancel each other, as discussed above. The radiation reflected by the blade mirrors BM is directed to a beam dump BD which may be cooled to prevent adverse effects on the performance of the apparatus. As the pupil facets are smaller than the field facets, the pupil spots reflected by the blade mirrors of FIGS. 13a and 13b are smaller than the field facets reflected by the blade mirrors of FIGS. 12a and 12b, thus a smaller beam dump may be used.

Although the embodiments shown in FIGS. 12a and 12b and 13a and 13b describe the blade mirrors as inserted or positioned in front of the field faceted mirror and the pupil faceted mirror, respectively, it should be appreciated that blade mirrors may be placed in front of both the field faceted mirror and the pupil faceted mirror. It should also be appreciated that the various exemplary embodiments may be used in combination. For example, the devices shown in FIGS. 3a-6, 8 and 11 may be used in combination with the embodiments shown in FIGS. 12a-13a.

Figure 15:
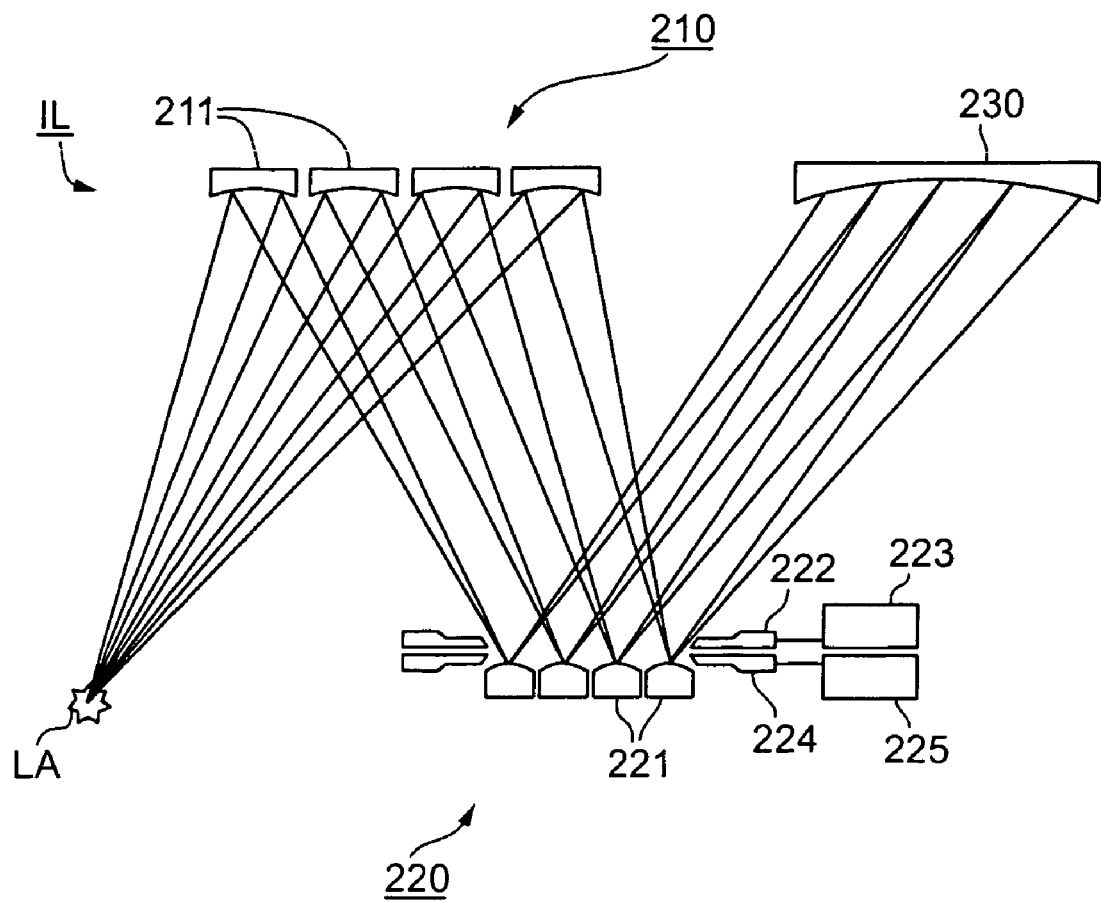
FIG. 15 depicts certain components of the illumination system of the apparatus of FIG. 1.

As shown in FIG. 15, the illumination system includes a field faceted mirror 210 having a plurality of facets 211 which receive radiation from the radiation source LA and form a plurality of images of the source LA on corresponding facets of pupil faceted mirror 220. The pupil facets 221, with the remainder of the illumination system IL including mirror 230, redirect the radiation such that the images of the field facets 211 overlap on the mask MA. The shape of the field facets 211 largely define the shape of the illumination field on the mask MA.

To control the illumination settings for illuminating the mask MA, a facet mask 222-225 is provided. The facet mask 222-225 includes a partially-opaque masking blade 222 and a solid masking blade 224 connected to respective actuators 223 and 225 so as to be selectively and incrementally closeable into the beam PB in front of respective facets of the pupil facets 211. Because the image in the pupil of the projection system PL is an image of the pupil faceted mirror 220 (they are in conjugate planes), selectively obscuring the outermost pupil facets 221 allows control over a, the ratio of the amount of the projection system pupil that is filled, if no diffraction (at the mask) were present. Obscuring the outermost facets reduces σ.

The facet mask 222-225 and its operation is shown in greater detail in FIGS. 16 to 19. Although in these figures the partially-opaque masking blade 222 is shown as solid, it include a large a number of apertures and opaque areas as possible subject to the constraint that the size and spacing of the apertures and opaque areas must be large compared to the wavelength of the beam so that diffraction does not occur and to practical considerations of manufacture. The opaque areas preferably have a total area sufficient to reduce by a predetermined fraction, preferably 50%, the radiation reflected by the pupil facet. It will be appreciated that since the beam PB is not incident on the pupil mirror 220 exactly normally, if the facet mask 222-225 is at all spaced from the pupil mirror 220, the total opaque area of the partially-opaque masking blade 222 as a fraction of the area of one of the facets will be a little less than the predetermined fraction of the beam PB that is to be absorbed.

Figure 16:
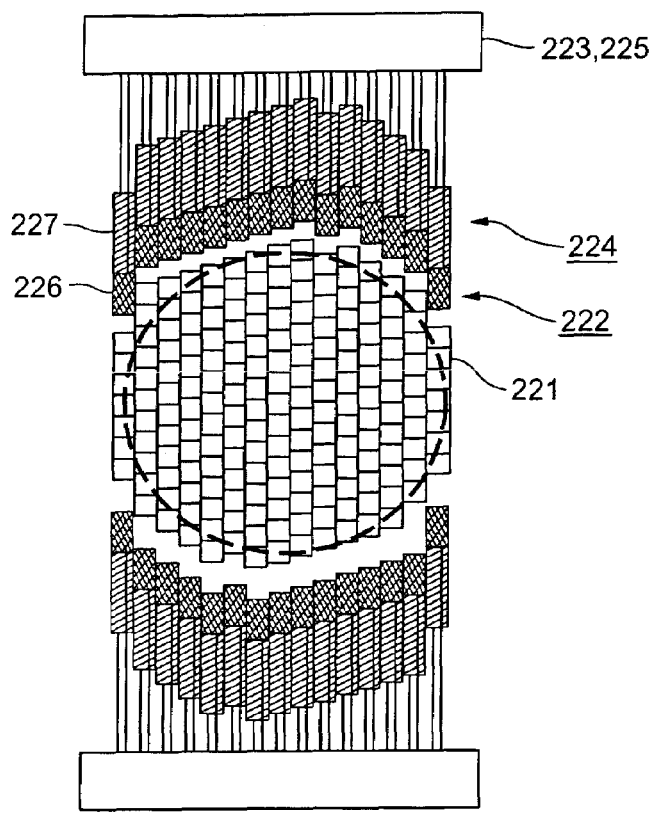
FIGS. 16 to 18 depict the facet masking means of the first embodiment of the invention in various positions.

As can be seen in FIG. 16, the pupil facets 221 are square and arranged in columns. Accordingly, the partially-opaque and solid masking blades 222 and 224 are constructed as a plurality of fingers 226 and 227, one of each per column of pupil facets 221, that are selectively and incrementally extendible to cover ones of the pupil facets 221. Preferably, independent control of each of the fingers 226 and 227 is provided to enable greater flexibility of the illumination settings, however in some circumstances pairs or groups of fingers may be grouped together.

Figure 20:
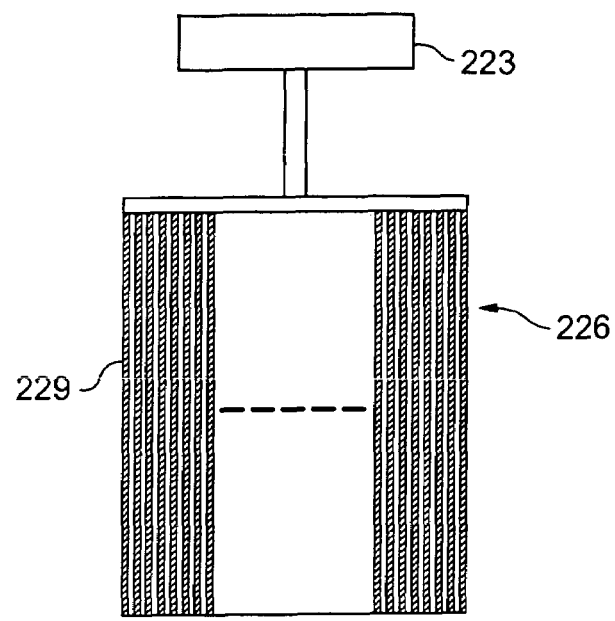
FIG. 20 depicts a partially opaque masking blade in accordance with the first embodiment of the present invention.

The partially-opaque masking fingers 226 may be constructed, for example, as a grid of rods, bars or wires or by forming apertures in a suitable pattern in a solid plate. A partially opaque masking finger 226 formed with a plurality of rods 229 is shown in FIG. 20.

In general, for other shapes and arrangements of pupil facets, the masking blades 222 and 224 may be arranged differently. For example, for pupil facets 221 arranged in concentric rings, the masking blades 222 and 224 may take the form of iris diaphragms. As an alternative to adjustable blades, it is possible to provide a plurality of blades, opaque and partially opaque, corresponding to the desired illumination settings and selectively interpose these into the beam as desired. Such fixed blades may be formed as plates with appropriate openings and partially opaque (apertured) areas and may be held in a magazine or carousel to be inserted into the beam.

Figure 17:
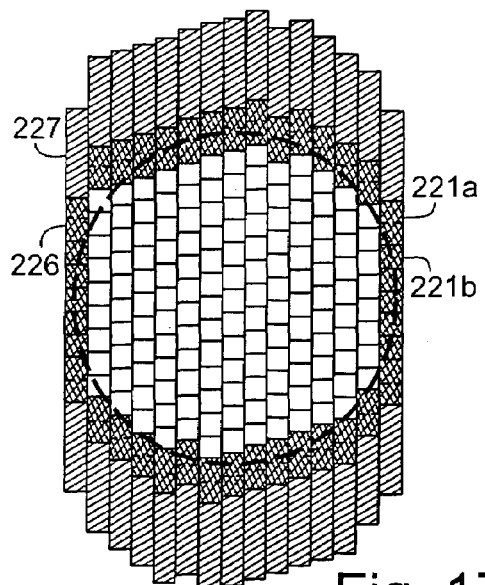
Figure 18:
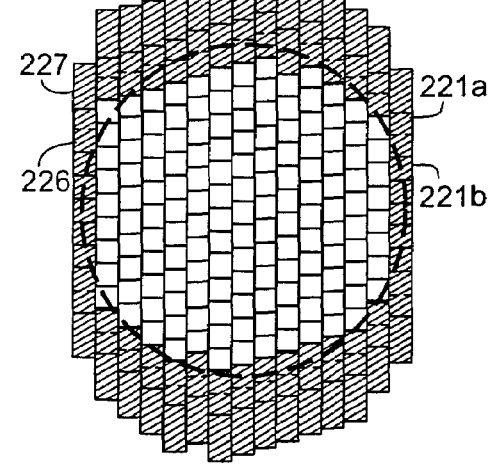

FIG. 16 shows the facet mask 222-225 in its neutral position, with both masking blades 222 and 224 (fingers 226 and 227) open leaving the pupil facets 221 clear. This setting provides the greatest σ. To reduce σ by the smallest amount, effectively a half step, the partially-opaque fingers 226 are extended one step so that the outermost ring of pupil facets 221a is covered, as shown in FIG. 17. The solid fingers 227 remain fully retracted and the inner pupil facets 221b are uncovered. To reduce σ further, the solid fingers 227 are extended one step, fully obscuring the outermost ring of pupil facets 221a, as shown in FIG. 18. Again, the inner pupil facets 221b remain uncovered. Further reductions in σ are achieved by further extending the fingers 226 and 227, extending the solid fingers 227 reduces σ in whole steps, while extending the partially-opaque fingers 226 one step more provides a half step reduction in σ. Extending the partially-opaque fingers 226 more than one step more than the solid fingers 227 provides an illumination intensity distribution with a more gradual decrease towards the edge of the pupil. Note that to provide circular illumination modes, the outermost fingers will move to obscure a whole column of facets while the central fingers advance only one facet width. When the central fingers move a further facet inwards the next outermost column will be obscured and so on. The aim being that the area of unobscured facets is as close to circular as possible.

By providing multiple partially-opaque masking blades with different blocking ratios, smaller increments in σ can be provided. For example, with two appropriately aligned partially-opaque masking blades, one blocking 25% of the radiation and one blocking 50%, quarter steps can be provided, the 25% masking blade extended one step more that the solid masking blade provides a quarter step, the 50% masking blade extended one step more gives a half step and both extended one step more gives a three quarter step.

Although the configurations illustrated are rotationally-symmetrical this is not always required or desired. For example, an elliptical pupil configuration may be created by covering facets in one direction only and multipole configurations may be created by covering the appropriate facets only.

Figure 19:
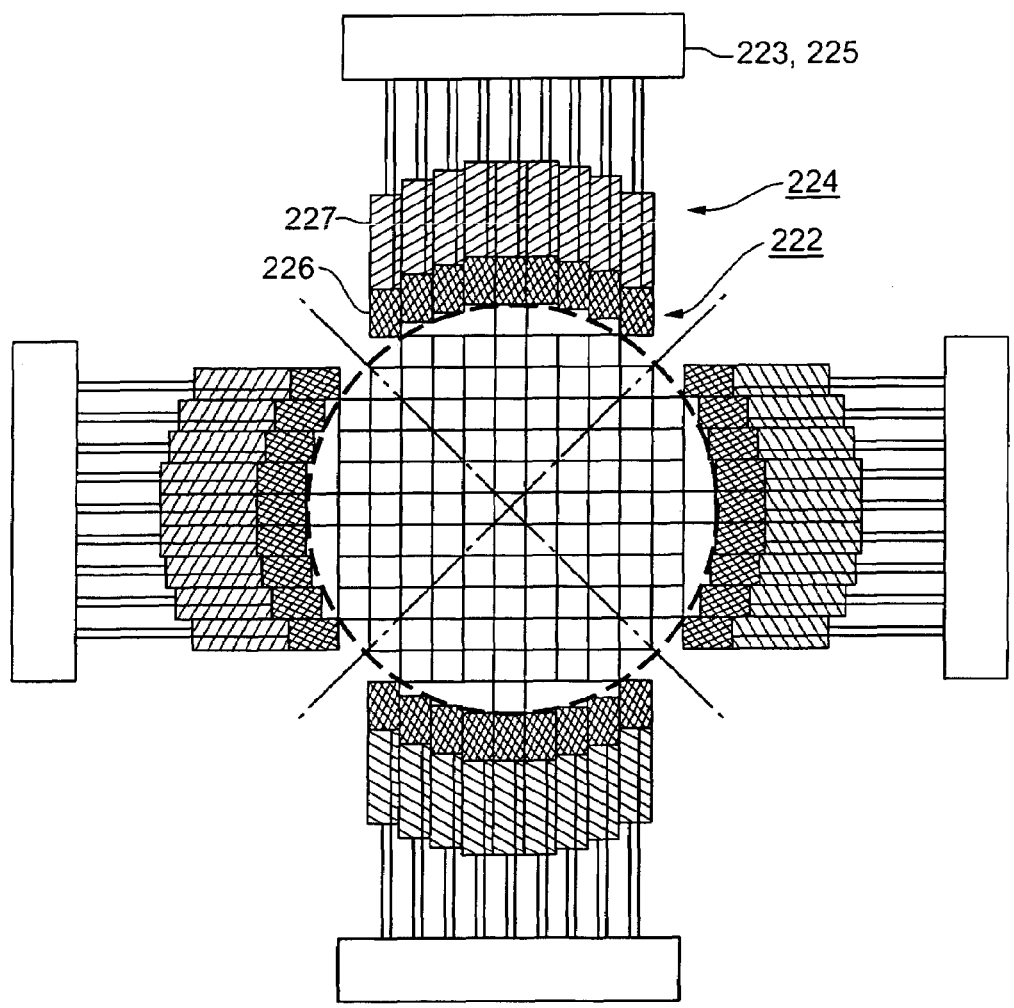
FIG. 19 depicts a partially opaque masking blade used in the first embodiment of the invention.

In a variant of the first embodiment, four sets of facet masking blades are used, arranged around four sides of the facet mirror. This is shown in FIG. 19 and can provide circular illumination modes with shorter movements of the fingers when the facets are arranged on a square grid.

Figure 21:
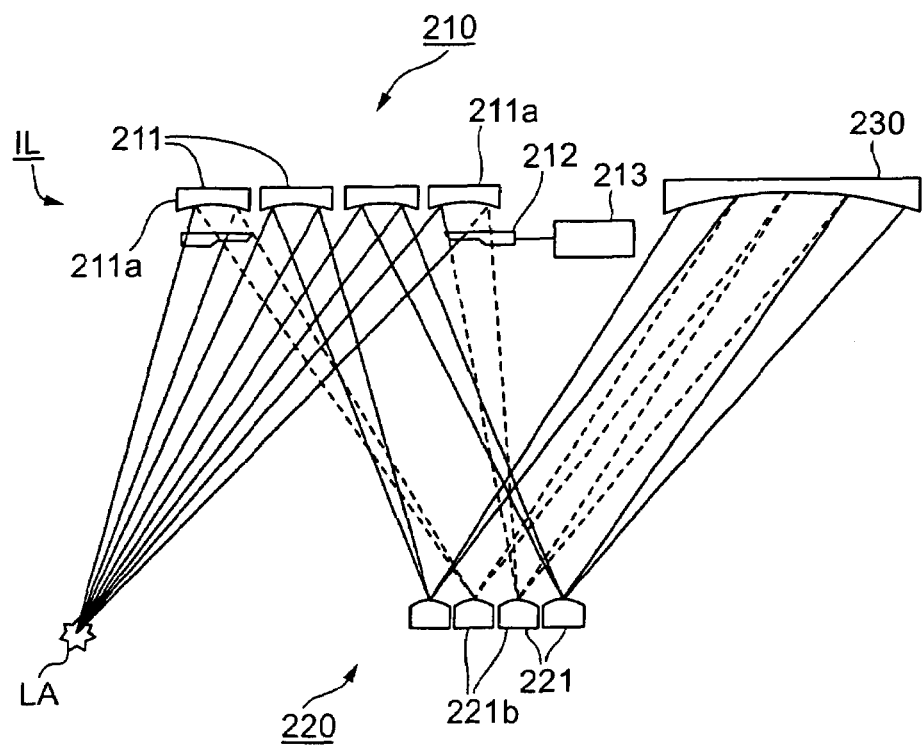
FIG. 21 depicts certain components of the illumination system of a second embodiment of the invention.
Figure 22:
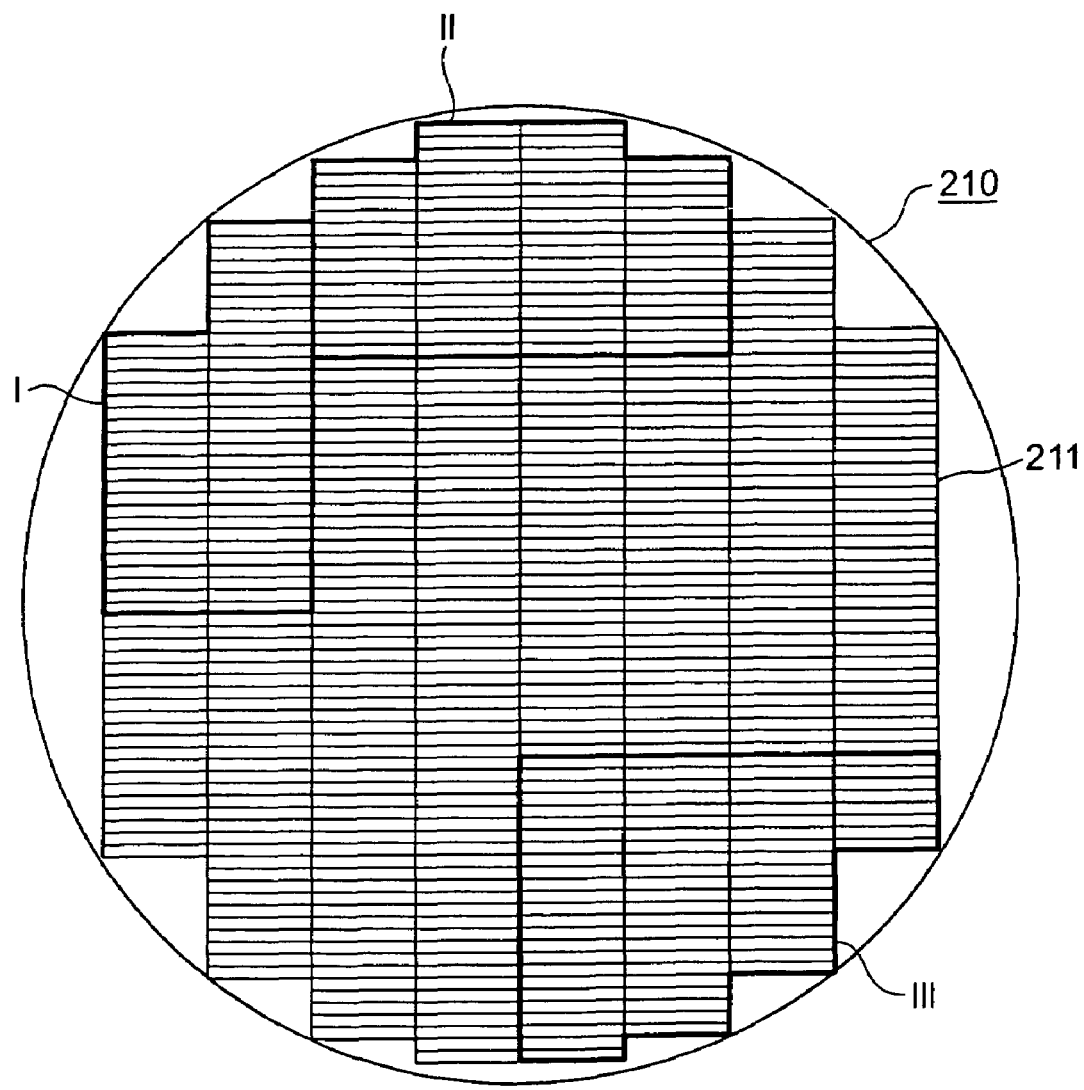
FIG. 22 depicts the field facet mirror of the second embodiment of the invention.

A second embodiment of the invention is shown in FIGS. 21 and 22. A facet mask 212, 213 (masking blade(s) 212 and actuator(s) 213) is provided proximate the field facet mirror 210. The facet mask 212, 213 may comprise a partially-opaque masking blade and a solid masking blade as in the first embodiment or simply a solid masking blade. Placing the facet mask at the field faceted mirror 210 rather than the pupil faceted mirror 220 can be advantageous in that the field facets 211 are generally larger in one direction than the pupil facets 221 so that there is additional room to provide the necessary mechanisms and it is easier to construct the partially-opaque masking blades at a larger scale. However, additional advantages can be obtained if the field facets 211 are arranged to fill pupil facets 221 other than those in the corresponding location in the pupil mirror. For example, the outermost field facets 211a may be arranged to fill the innermost pupil facets 221b and vice versa, as shown in FIG. 21. In that case, closing the facet mask 212, 213 to obscure the outermost field facets 211a removes the illumination from the innermost pupil facets 221b, providing an annular illumination mode.

FIG. 22 shows the field facet mirror 210, which is the same as in the first embodiment. The field facet mirror 210 comprises a plurality of field facets 211 which are rectangular with a high aspect ratio and arranged in rows and columns. The facet mask 212, 213 can be embodied as a plurality of selectively extendible fingers as in the pupil facet mask of the first embodiment or as simple blades to mask a whole block of field facets 211 at a time.

The correspondence between the various pupil facets 221 and field facets 211 can be chosen such that an area of adjacent field facets 211 on field facet mirror 210 corresponds to a specific set of pupil facets 221 on pupil facet mirror 220. For instance, area I of field facets 211 may be chosen to correspond to a ring of pupil facets 221, area II to correspond to another ring of pupil facets and area III to an inner circular area of pupil facets 221. Areas I, II and III are easily blocked by respective masking blades, whereas it might be much harder to block only the corresponding pupil facets, enabling the selection of different σ values or annular illumination. Different arrangements of the correspondence between field and pupil facets can be used to provide other illumination modes, such as dipole and quadrupole configurations and configurations that are complementary to the above configurations.

The facet mask of the first embodiment may be combined with that of the second embodiment to provide independent control of the inner and outer radii of an annular illumination mode ($\sigma_{inner}$ and $\sigma_{outer}$).

This and other aspects are achieved according to the invention in a lithographic apparatus including a radiation system having reflective optical elements constructed and arranged to supply a beam of radiation, the reflective optical elements including a first faceted mirror constructed and arranged to generate a plurality of source images on a second faceted mirror; a support structure constructed and arranged to support a patterning device, the patterning device constructed and arranged to pattern the beam according to a desired pattern; a substrate table constructed and arranged to hold a substrate; a projection system constructed and arranged to project the patterned beam onto a target portion of the substrate; and a facet mask constructed and arranged to selectively mask one or more of the facets of one of the first and second faceted mirrors and comprising a partially-opaque masking blade selectively interposable into the beam, the partially-opaque masking blade having an arrangement of opaque and transparent areas having a pitch sufficiently large so as to cause negligible diffraction of the beam.

By using a partially-opaque masking blade to selectively mask one or more facets, part of the radiation from that facet can be blocked without causing unacceptable inhomogeneity in the illumination of the patterning device, irrespective of the fact that the exact location of the source image on the pupil facet is not known. In this way, intermediate illumination settings, between masking and not masking whole facets or rings of facets, can be provided.

The pitch should be small relative to the source image, so that the proportion of radiation blocked is independent of the source position, but not sufficiently small to cause diffraction of the beam. Preferably, for an apparatus using EUV as the exposure radiation, the pitch is in the range of from 1 mm to 500 nm, dependent on the size of the facets and the illuminated area.

The facet mask is preferably further controlled to adjust the proportion of the area of a facet that is obscured, for example by having a plurality of partially-opaque blades selectively interposable into the beam. This enables multiple intermediate illumination settings, providing further versatility.

Preferably, the facet mask is arranged proximate the second (pupil) faceted mirror as this provides the most homogeneous illumination of the patterning device.

A second aspect of the present invention provides a lithographic apparatus as specified in the a radiation system having reflective optical elements constructed and arranged to supply a beam of radiation, the reflective optical elements including a first faceted mirror constructed and arranged to generate a plurality of source images on a second faceted mirror; a support structure constructed and arranged to support a patterning device, the patterning device constructed and arranged to pattern the beam according to a desired pattern; a substrate table constructed and arranged to hold a substrate; a projection system constructed and arranged to project the patterned beam onto a target portion of the substrate; and a facet mask constructed and arranged to selectively mask one or more of the facets of the first faceted mirror.

Since all radiation from one facet of the first (field) faceted mirror is incident on one facet of the second faceted mirror, equivalent illumination control can be achieved by selectively blocking field facets as by blocking pupil facets. Normally however, it would not be contemplated to control illumination settings, such as a, at this position since this is not a pupil plane and so selective obscuration at this position would be expected to cause non-uniformities in the illumination of the patterning device. However, because the field and pupil mirrors are faceted, selective masking of whole field facets can be performed without unacceptable loss of uniformity.

The facets may be arranged so that field facets illuminate pupil facets in different positions, for example facets near the periphery of the field facet mirror may direct radiation to more centrally positioned facets of the pupil facet mirror. Thus annular illumination modes may be set more easily, without partial obscuration of the outer pupil facets and illumination modes that would require masking of inaccessible pupil faces can be set.

Of course, the facet mask of the second aspect of the present invention may be the same as that of the first aspect and the two aspects may be combined to have selective masking of both field and pupil facets. Thereby, independent control of the inner and outer radii ($\sigma_{inner}$ and $\sigma_{outer}$) of an annular illumination mode can be achieved.

According to a further aspect of the invention there is provided a device manufacturing method including providing a substrate that is at least partially covered by a layer of radiation-sensitive material; providing a beam of radiation using a radiation system having reflective optical elements constructed and arranged to supply a beam of radiation, the reflective optical elements including a first faceted mirror constructed and arranged to generate a plurality of source images on a second faceted mirror; using a patterning device to endow the beam with a pattern in its cross-section; projecting the patterned beam of radiation onto a target portion of the layer of radiation-sensitive material; and selectively masking one or more facets of one of the first and second faceted mirrors by selectively interposing a partially-opaque masking blade into the beam, the partially-opaque masking blade having an arrangement of transparent and opaque areas having a pitch sufficiently large so as to cause negligible diffraction of the beam.

While specific embodiments of the invention have been described above, it will be appreciated that the invention may be practiced otherwise than as described. The description is not intended to limit the invention.

What is claimed is:

1. A lithographic projection apparatus, comprising:
   an illumination system configured to condition a beam of radiation from a radiation source;
   a support structure configured to support a patterning device, the patterning device configured to pattern the beam of radiation according to a desired pattern;
   a substrate table configured to hold a substrate;
   a projection system configured to project the patterned beam of radiation onto a target portion of the substrate; and
   a device positioned in a first plane intermediate a second plane conjugate to a plane of the substrate and a third plane conjugate to a pupil plane of the projection system, the first plane located between the radiation source and the support structure, and the device comprising a blade selectively insertable into the beam of radiation, wherein the blade includes a solid blade and a partially opaque blade, wherein the partially opaque blade comprises a grid of rods, bars or wires.

2. The apparatus of claim 1, wherein the device includes a plurality of partially opaque blades, each partially opaque blade having a different blocking ratio.

3. The apparatus of claim 1, wherein the blade has a predetermined transmissibility pattern.

4. The apparatus of claim 3, wherein the blade is insertable into the beam of radiation in a first direction in which the support structure and the substrate table are movable with respect to each other and the transmissibility of the blade varies in a second direction perpendicular to the first direction.

5. The apparatus of claim 1, wherein the illumination system includes a field faceted mirror and a pupil faceted mirror in order along a direction of propagation of the beam of radiation and the device is positioned between the pupil faceted mirror and the support structure.

6. The apparatus of claim 5, further comprising a reflective blade selectively insertable into the beam of radiation in front of a facet of the field faceted mirror, the pupil faceted mirror, or both the field faceted mirror and the pupil faceted mirror, to reflect a portion of the beam of radiation to a beam dump.

7. The apparatus of claim 6, wherein the reflective blade includes a coating configured to scatter the portion of the beam of radiation or change a phase of the portion of the beam of radiation.

8. A device manufacturing method, comprising:
   using a patterning device to endow a beam of radiation from a radiation source with a pattern in its cross-section;
   projecting the patterned beam of radiation onto a target portion of a layer of radiation-sensitive material at least partially covering a substrate using a projection system; and
   selectively inserting a blade of a plurality of blades into the beam of radiation in a first plane intermediate a second plane conjugate to a plane of the substrate and a third plane conjugate to a pupil plane of the projection system, the first plane located between the radiation source and the patterning device, wherein the blade includes a solid blade and a partially opaque blade, wherein the partially opaque blade comprises a arid of rods, bars or wires.

9. The method of claim 8, wherein the device includes a plurality of partially opaque blades, each of the partially opaque blades having a different blocking ratio.

10. The method of claim 8, wherein each blade has a predetermined transmissibility pattern.

11. The method of claim 10, wherein the blades are insertable into the beam of radiation in a first direction in which the patterning device and the substrate are movable with respect to each other and the transmissibility of the blades varies in a second direction perpendicular to the first direction.

12. The method of claim 8, further comprising propagating the beam of radiation using a field faceted mirror and a pupil faceted mirror in order along a direction of propagation of the beam of radiation and selectively inserting the blade of the plurality of blades between the pupil faceted mirror and the patterning device.

13. The method of claim 12, further comprising selectively inserting a plurality of reflective blades into the beam of radiation in front of a facet of the field faceted mirror, the pupil faceted mirror, or both the field faceted mirror and the pupil faceted mirror, to reflect a portion of the beam of radiation to a beam dump.

14. The method of claim 13, wherein the reflective blades include a coating configured to scatter the portion of the beam of radiation or change a phase of the portion of the beam of radiation.

15. A lithographic projection apparatus, comprising:
   an illumination system having a plurality of mirrors;
   a support configured to support a patterning device, the patterning device configured to pattern the beam of radiation according to a desired pattern;
   a substrate table configured to hold a substrate;
   a projection system configured to project the patterned beam of radiation onto a target portion of the substrate, the projection system having a plurality of mirrors; and
   a reflective blade selectively insertable into the beam of radiation in front of at least one of the plurality of mirrors to reflect a portion of the beam of radiation to a beam dump.

16. The apparatus according to claim 15, wherein the reflective blade includes a coating configured to scatter the portion of the beam of radiation or change a phase of the portion of the beam of radiation.

* * * * *